(12) United States Patent
Lin

(10) Patent No.: US 7,132,334 B2
(45) Date of Patent: Nov. 7, 2006

(54) METHODS OF CODE PROGRAMMING A MASK ROM DEVICE

(75) Inventor: Shun Li Lin, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 160 days.

(21) Appl. No.: 10/668,906

(22) Filed: Sep. 23, 2003

(65) Prior Publication Data
US 2005/0064668 A1    Mar. 24, 2005

(51) Int. Cl.
*H01L 21/8234* (2006.01)
(52) U.S. Cl. ........................... 438/275; 438/278
(58) Field of Classification Search ......... 438/275–278
See application file for complete search history.

(56) References Cited

U.S. PATENT DOCUMENTS

| | | | |
|---|---|---|---|
| 5,707,765 A | 1/1998 | Chen | |
| 6,022,644 A | 2/2000 | Lin | |
| 6,397,377 B1 | 5/2002 | Wang et al. | |
| 6,417,548 B1 | 7/2002 | Sheu et al. | |
| 6,420,235 B1 | 7/2002 | Wang | |
| 6,436,772 B1 * | 8/2002 | Otsuki | 438/278 |
| 6,689,663 B1 * | 2/2004 | Chang et al. | 438/275 |

* cited by examiner

*Primary Examiner*—Jack Chen
(74) *Attorney, Agent, or Firm*—Stout, Uxa, Buyan & Mullins, LLP

(57) ABSTRACT

A method of code programming a mask read only memory (ROM) is disclosed. A method of the present invention includes forming a layer of developable anti-reflective coating over a plurality of code openings located on a substrate of a ROM device. The plurality of code openings are typically elements of a first code, or pre-code, pattern, and a portion of the developable anti-reflective coating layer is removed or processed to define a second code, or real-code, pattern of the device. The method may be practiced by applying and patterning a layer of photoresist material over the developable anti-reflective coating to form a second code pattern, and then removing portions of the developable anti-reflective coating that remain exposed beneath the patterned photoresist material.

25 Claims, 2 Drawing Sheets

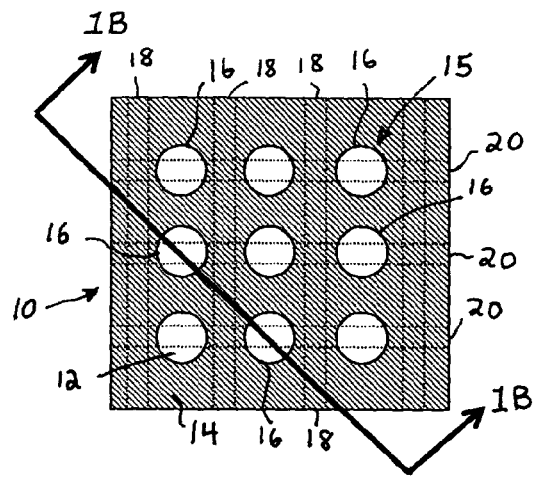
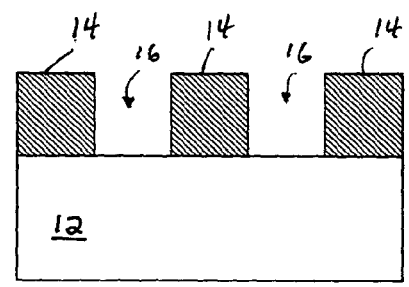
FIG. 1A             FIG. 1B
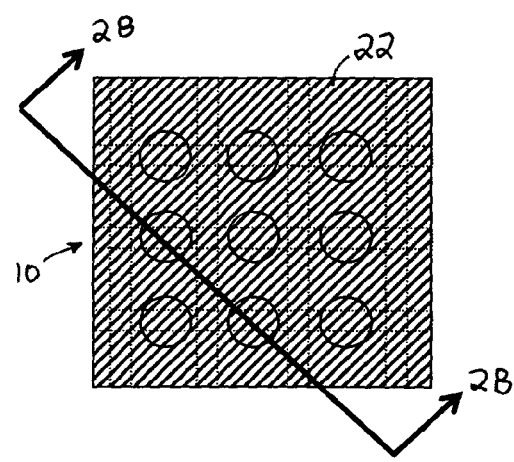
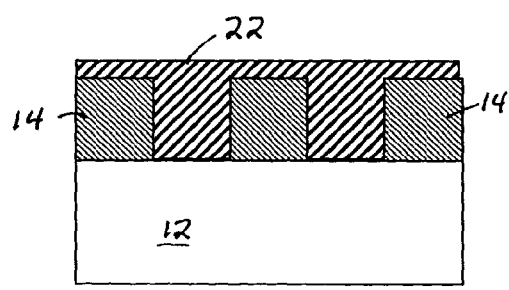
FIG. 2A             FIG. 2B

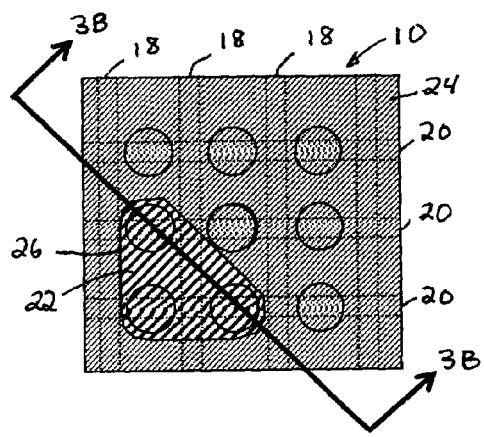
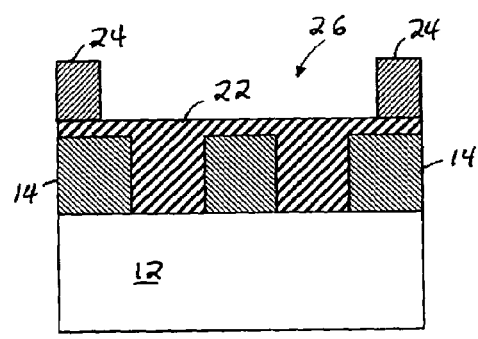
FIG. 3A  FIG. 3B
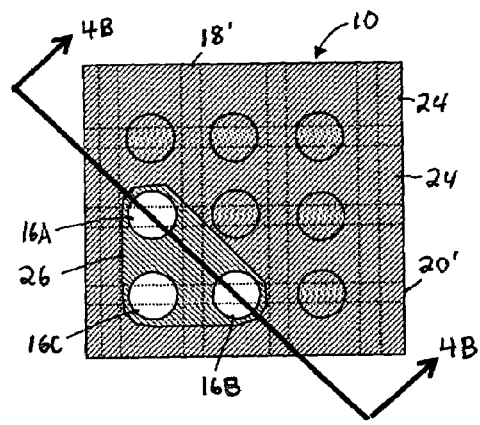
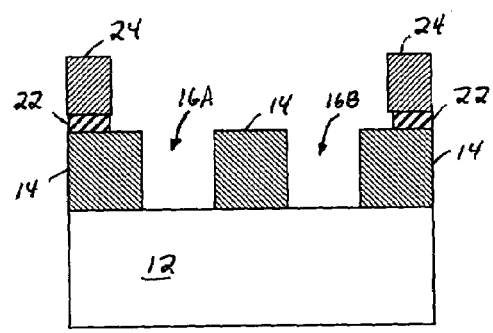
FIG. 4A  FIG. 4B

METHODS OF CODE PROGRAMMING A MASK ROM DEVICE

BACKGROUND OF THE INVENTION

1. Field of the Invention

The present invention relates to non-volatile memory devices and, more particularly, to methods of code programming read-only memory (ROM) semiconductor devices.

2. Description of Related Art

A non-volatile, semiconductor memory device is designed to securely hold data even when power is lost or removed from the memory device. The read-only memory (ROM) is a non-volatile memory device widely used in microprocessor-based digital electronic equipment for storing predetermined programs.

Arrays of memory cells are conventionally disposed in ROM devices for storing data, wherein each memory cell includes a transistor. These transistors, which typically comprise metal-oxide-semiconductor field effect transistors (MOSFETs), are disposed near intersecting bit lines and word lines of the memory device. Data bit values or codes held by these memory cell transistors are permanently stored in the physical or electrical properties of the individual memory cells.

A method of programming ROM devices, such as semiconductor devices, which has been explored by the Applicant uses an etch-back spin on glass (SOG) process to expose portions of a photoresist layer located on a substrate, such as a silicon wafer. The etch-back process may be used in forming a pre-code pattern of memory cells on the substrate, which may be used in an attempt to provide larger windows for photo processing. The pre-code pattern can generally be non-selective, and can include all of the potential code positions on the device.

In comparison, a real-code pattern can be formed after the pre-code pattern, and the particular real-code pattern or patterns can be selected based on the desired performance characteristics of the ROM device. To prevent exposure to non-real code pattern positions, such as the code positions that are not elements of the real-code pattern, such a current ROM device processing method explored by the Applicant may utilize wet etched SOG processes. Such a method can be relatively complex and may not provide the desired amount of control in shaping of the processing windows.

Thus, there is a need for improved methods of programming or patterning ROM devices which are simpler and which can provide improved control over spatial aspects of processing windows.

SUMMARY OF THE INVENTION

The present invention addresses these needs by providing, in accordance with one aspect, non-volatile memory coding structures and methods for making the same which can be fast, clean, controlled, and simple in construction.

In one embodiment, a method of programming or patterning a ROM device comprises forming a layer of developable anti-reflective coating (DeARC) on a substrate. The substrate typically has a plurality of code positions, and a first code, or pre-code, pattern which comprises a plurality of code openings that expose substantially all of the code positions. The DeARC is formed such that substantially all of the code openings are filed with the DeARC. The DeARC may then be removed in predetermined regions to form a second code pattern, or real-code, pattern.

In another embodiment, a method of programming or patterning a ROM device, which has bit lines oriented in a first direction within a substrate, word lines formed above the bit lines in a second direction such that the bit lines and word lines define code positions, and a first implant resistant material located over the word lines, comprises forming two or more code openings over the code positions. The code openings are formed in the first implant resistant material to form a first code pattern which comprises substantially all of the code openings. A layer of DeARC is formed over the substrate to fill substantially all of the code openings. The layer of DeARC is shown as also being formed over the first implant resistant material. A second implant resistant layer is formed over the DeARC. In this embodiment, a portion of the second implant resistant material is processed to form a second code pattern which comprises a portion of the code openings of the first code pattern. After formation of the second code pattern, the DeARC is removed from the code openings.

Thus, by way of the present invention, methods are disclosed for manufacturing ROM devices, such as Mask ROM devices, with reduced complexity and without using an etch-back process.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112.

Any feature or combination of features described herein are included within the scope of the present invention provided that the features included in any such combination are not mutually inconsistent as will be apparent from the context, this specification, and the knowledge of one skilled in the art. For purposes of summarizing the present invention, certain aspects, advantages and novel features of the present invention are described herein. Of course, it is to be understood that not necessarily all such aspects, advantages or features will be embodied in any particular embodiment of the present invention. Additional advantages and aspects of the present invention are apparent in the following detailed description and claims.

BRIEF DESCRIPTION OF THE DRAWINGS

FIG. 1A is a top plan view of a read-only memory device having a pre-code pattern formed on a substrate;

FIG. 1B is a cross-sectional view of the device of FIG. 1A taken along line 1B;

FIG. 2A is a top plan view of the device of FIG. 1A including a layer of developable anti-reflective coating located over the pre-code pattern;

FIG. 2B is a cross-sectional view of the device of FIG. 2A taken along line 2B;

FIG. 3A is a top plan view of the device of FIG. 2A including a layer of photoresist over the developable anti-reflective coating;

FIG. 3B is a cross-sectional view of the device of FIG. 3A taken along line 3B;

FIG. 4A is a top plan view of the device of FIG. 3A including a real code pattern formed on the device; and FIG. 4B is a cross-sectional view of the device of FIG. 4A taken along line 4B.

DETAILED DESCRIPTION OF THE PRESENTLY PREFERRED EMBODIMENTS

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in greatly simplified form and are not to precise scale. In reference to the disclosure herein, for purposes of convenience and clarity only, directional terms, such as, top, bottom, left, right, up, down, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to cover all modifications, alternatives, and equivalents as may fall within the spirit and scope of the invention as defined by the appended claims. For example, it is understood by a person of ordinary skill in the art that the pre-code and real-code patterns formed by the methods of the present invention may be formed in NMOS, PMOS, CMOS and bipolar devices, to provide effective ion implantation in high density memory cells.

It is to be understood and appreciated that the process steps and structures described herein do not cover a complete process flow for the manufacture of memory devices. The present invention may be practiced in conjunction with various integrated circuit fabrication and coding techniques that are conventionally used in the art, and only so much of the commonly practiced process steps are included herein as are necessary to provide an understanding of the present invention.

Referring to the figures, and particularly FIG. 1A and FIG. 1B, a ROM device 10, such as a mask ROM device, is shown. The ROM device 10 includes an array of mask ROM cells disposed on a semiconductor substrate 12, which may comprise for example silicon or polysilicon, having a plurality of orthogonally arranged bit lines 18 and word lines 20. The bit lines 18 are formed before the word lines 20 in the illustrated embodiment. In this embodiment, the substrate 12 can comprise a background impurity type, and the bit lines 18 can be parallel formed therein by implantation of an impurity type opposite the background impurity type. For instance, the substrate can have a P-type background impurity type and the bit lines can be formed using N-type dopant, such as Arsenic or Phosphorous, ion implantation.

After formation of the bit lines 18, a gate oxide layer (not shown) is preferably formed on the substrate 12 to a thickness of about 50 to about 300 Angstroms. The gate oxide can be grown using a thermal oxide process, which is preferentially performed in a chemical vapor deposition (CVD) furnace.

A conductive layer is then typically deposited by CVD, wherein the conductive layer has a grain size sufficient to exhibit desirable electrical properties. A photoresist material is spun over the conductive layer and patterned by exposure to ultraviolet (UV) radiation. The pattern projected onto the photoresist is that of a plurality of parallel strips. An etch process is used to transfer the pattern into the conductive layer by etching back exposed portions of the polysilicon. The photoresist is subsequently removed to reveal a plurality of memory cell word lines 20, which in the illustrated embodiment are parallel to one another and orthogonal to the bit lines 18. These word lines 20, which preferably comprise a conductive material such as polysilicon, can be formed using low pressure chemical vapor deposition (LPCVD). As presently embodied, the bit lines 18 and the word lines 20 have widths of about 0.15 microns, and the word lines 20 are spaced apart by about 0.15 microns.

The bit lines 18 and word lines 20 in combination form MOSFET memory cells, which are defined at each grouping of a word line 20 and two bit lines 18. The bit lines 18 on the sides of each MOSFET memory cell serve as source/drain regions, and the part of the word line 20 disposed between the source and drain regions serves as the gate of the MOSFET memory cell.

The MOSFET memory cells, which can be accessed via the corresponding bit lines 18 and word lines 20 to which they are connected, hold the data (or code) of the mask ROM. When a MOSFET memory cell is accessed, a voltage applied at its gate by the word line 20 will either be higher or lower than a threshold voltage required for the gate to facilitate conduction between the source/drain bit lines 18. If the applied gate voltage is at or higher than the threshold voltage, the MOSFET memory cell is turned on permitting a logic "1" value to be read; otherwise the MOSFET memory cell is not turned on and a logic "0" value is read from the MOSFET memory cell.

When the channel of a given MOSFET memory cell is ion implanted, its voltage threshold can be increased so that it will have a logic "0" value. The channel of a given MOSFET memory cell to be implanted is located in the substrate under the word line 20 and between the adjacent bit lines 18. As distinguished from ion-implanted cells, non-implanted MOSFET memory cells will have a logic "1" value and continue to conduct when potentials are applied to their gates via the word lines 20. The mask ROM can thus be programmed using ion implantation to change the logic values of selected MOSFET memory cells from logic "1" values to logic "0" values.

Properly masking the channel regions of MOSFET memory cells which are not to be implanted is a critical step in the code programming process. According to one aspect of the present invention, an implant resistant layer 14 is formed over the substrate 12 to shield certain MOSFET memory cells from implanting. The implant resistant layer 14 may comprise, for example, organic polymers or dielectric materials. In certain implementations, implant resistant layers may comprise organic polymers such as photoresist and/or inorganic films, such as plasma enhanced tetraethylortho silicate (PETEOS) formed using, e.g., CVD, or low pressure tetraethyl orthosilicate (LPTEOS) formed using, e.g., heat. Regarding photoresist materials, they can be employed for photolithographic purposes as either positive photoresist, negative photoresist, or combinations thereof. Positive photoresist, also known as light-softening photoresist, can be depolymerized by exposure to radiation such as UV light. Therefore, with positive photoresist, areas exposed to radiation are dissolved upon placement in a developer, while the masked, unexposed areas remain unaffected. On the other hand, negative photoresist, which is a light-hardening photoresist, can be polymerized by exposure to radiation, meaning that the exposed areas remain, while the covered areas are dissolved. Thus, depending on the type of photoresist utilized, the pattern transferred to the photoresist on the wafer is either a positive or a negative image of the photomask pattern. In one embodiment, implant resistant layer 14 comprises a photoresist material which is hardened for example to prevent intermixing with a subsequently-applied developable anti-reflective coating (DeARC), as described herein. In another embodiment, implant resistant layer 14 comprises a dielectric material, such as a silicon dioxide ($SiO_2$), silicon nitride (SiN), or silicon oxy-nitride (SiON). In accordance with an aspect of the present invention, negative photoresist may be used instead of positive photoresist in the context of sub-0.25 micron device dimensions. Negative photoresist may better maintain its profile through successive processing steps.

The implant resistant layer 14 can be formed on the substrate 12 using conventional methods, as disclosed herein. The implant resistant layer 14 is then patterned using for example known photolithographic and/or etching techniques to form a plurality of code openings 16 located in the implant resistant layer 14 and over the substrate 12, as shown in FIG. 1A and FIG. 1B. The code openings 16 are typically formed over word lines 20 between pairs of bit lines 18. The implant resistant layer 14 may be referred to as a first implant resistant layer. The first implant resistant layer is thus patterned to form a first code pattern 15 which comprises the plurality of code openings 16. In the illustrated embodiment, the first code pattern 15, or the pre-code pattern 15, includes substantially all of the code positions available on the substrate. In a preferred embodiment, every code position available on the substrate corresponds to a code opening 16. In the illustrated embodiment, the first code pattern 15 may be formed in a layer of hardened photoresist material or in a layer of silicon dioxide. For example, negative photoresist may be hardened before, during, and/or after formation of the code openings 16. Photoresist may be hardened, typically after patterning, for example, by treating the photoresist with at least one of a treatment implant and a treatment plasma from a plasma etcher.

As shown in FIG. 2A and FIG. 2B, a developable anti-reflective coating (DeARC) 22 is formed over the substrate 12 and the implant resistant layer 14. The DeARC 22 may also be a developable bottom anti-reflective coating (DeARC), as used herein. The DeARC 22 may be formed over the substrate 12 using any conventional process. In the illustrated embodiment, the DeARC layer 22 is formed using a well-known spin-on coating method. The DeARC is highly absorbing, and preferably absorbs most of the radiation penetrating a subsequently-applied photoresist, thereby reducing any reflective notching, standing wave effects and/or scattering of the radiation.

In the presently preferred embodiment, the DeARC can comprise compositions suitable for positive or negative resist processes available from Brewer Science, Inc. (Rolla, Mo., U.S.A.) or Clariant Corporation. Other materials may be used as a DeARC so long as for example the materials do not intermix with the implant resistant layer 14 and can be removed by photo developer. The DeARC is typically formed to have a thickness from about 200 Å to about 2000 Å depending on process needs, and more preferably having a thickness from about 550 Å to about 700 Å, and in an illustrated embodiment having a thickness of about 600 Å. The DeARC 22 is preferably formed over the substrate 12 and over the patterned implant resistant layer 14 to fill substantially all of the code openings 16, and preferably all of the code openings 16.

In the illustrated embodiment shown in FIG. 3A and FIG. 3B, a second implant resistant material 24 is then formed over the DeARC 22. The second implant resistant material 24 may be a photoresist material. In another embodiment, the second implant resistant layer 24 may comprise the same material as the first implant resistant layer 14. In yet another embodiment, the first implant resistant layer 14 can be a negative photoresist that will not intermix with a subsequently-applied second implant resistant layer 24, or, in another embodiment, vice versa. The second implant resistant material 24 may be formed over the substrate 12 using any conventional method, such as spin-on coating, as understood by persons skilled in the art.

The second implant resistant layer 24 can then be patterned to form a second code pattern 26, which is different from the first code pattern 15, as described herein and as shown in FIG. 3 and FIG. 4. When the second implant resistant material 24 comprises a photoresist, the second implant resistant material 24 can be patterned using well-known photolithography masking and exposure techniques followed by removal of relatively depolymerized portions of the second implant resistant material 24 by for example rinsing in a developer, to thereby shape the second implant resistant material 24 into the second code pattern 26.

After the second implant resistant layer 24 has been patterned to the desired configuration corresponding to the second code pattern 26, the DeARC 22 could be removed from exposed regions (e.g., the regions of the second code pattern 26) to expose the underlying substrate, such as substrate 12, as shown in FIG. 4A and FIG. 4B. Portions of the DeARC 22, which are not shielded by the patterned second implant resistant material 24, are then removed from areas of the substrate 12 to thereby transfer the second code pattern 26 from the patterned second implant resistant material 24 (FIG. 3) to the DeARC 22 (FIG. 4). In the illustrated embodiment, the second code pattern 26 (FIG. 4) corresponds to a real-code pattern. Typically, the removal of the DeARC 22 is accomplished by the use of a photo developer. The degree or rate of removal of the DeARC 22 may be controlled by a baking temperature of the device during the processing thereof, and/or by controlling an amount of light exposure to the DeARC. The exposed DeARC 22 can be removed with the same developer that is used to remove the photoresist 24, all in one step, or different developers can be used.

The second code pattern 26 (FIG. 3 and FIG. 4) typically has an area that is less than the area of the first code pattern 15. In other words, the second code pattern 26 typically includes less than all of the code openings 16 of the first code pattern 15. The second code pattern 26 can include non-overlapping areas which comprise one or more code openings 16 of the first code pattern 15. Thus, the second code pattern 26 comprises a portion of the code openings of the first code pattern 15.

In the cross-sectional view of FIG. 4B, an opening of the second code pattern 26 encompasses two of the first code openings 16A and 16B. In the illustrated embodiment, openings of the second code pattern 26 formed by the DeARC 22 can be slightly wider, as shown, than corresponding openings of the second code pattern 26 formed by the second implant resistant layer 24.

As depicted in FIG. 4B, the methods disclosed herein can be effective to provide a relatively wider photo process window compared to methods which do not utilize a DeARC.

While the first code pattern 15 exposes all of the areas that are possible to code, the second code pattern 26 exposes only those layers that are to be coded with a value of "0" for the particular device being created. Following formation of the real-code openings, coding by ion implantation may be performed to implant exposed portions of the substrate corresponding to channels to be coded. In an alternative embodiment, portions of the second code pattern 26 remain over lengths of bit lines 18, and in one preferred embodiment over entire lengths of bit lines 18, to thereby not expose those bit lines 18 and help protect them from being contaminated with implant species during the coding step. For example, with reference to FIG. 4A, the second code pattern 26 can be formed to comprise a first window exposing only first code openings 16A and 16C and a second window exposing only the first code opening 16B, wherein all or a part of bit line 18' is not exposed. In such an exemplary embodiment, the part of bit line 18', which would otherwise be exposed by a single code opening encompassing 16A, 16B, 16C such as shown, would be protected and/or not entirely exposed by the first and second windows. Thus, in this embodiment, the second code pattern comprises windows extending between bit lines and exposing portions of word lines corresponding to channels to be coded, whereby portions of bit lines (e.g., 18') disposed between adjacent code positions (e.g., 16B, 16C) of a word line (e.g., 20') are not exposed by the windows. In this way, the second implant resistant layer 24 extends over and protects a bit line 18' region, which is located between two adjacent code positions 16B, 16C of a word line 20', from being contaminated with implant species during a subsequent coding step.

After coding, remaining portions of the first implant resistant layer 14, the DeARC 22, and the second implant resistant layer 24 can be removed. In embodiments wherein the first implant resistant layer 14 and the second implant resistant layer 24 are both photoresist, the first implant resistant layer 14, the DeARC 22, and the second implant resistant layer 24 can be removed by for example first performing a dry strip and then a wet strip. In embodiments wherein at least one of the first implant resistant layer 14 and the second implant resistant layer 24 is photoresist, it may be desirable to remove that layer using, for example, oxygen plasma in association with heated sulfuric acid. When one or more of the first implant resistant layer 14 and the second implant resistant layer 24 comprises an inorganic film, it may not be necessary to remove the inorganic film since the inorganic film can form part of a dielectric film stack after a dielectric film is deposited on the ROM device.

In view of the disclosure herein, a method of code programming a ROM device comprises providing a substrate 12, such as a semiconductor substrate, which has a plurality of code positions and a first code pattern 15 which comprises a plurality of code openings 16 that expose substantially all of the code positions, and forming a DeARC over the substrate 12 to fill the plurality of code openings 16.

In another embodiment, a method of code programming a ROM device which has bit lines 18 oriented in a first direction within a substrate 12, word lines 20 formed above the bit lines 18 in a second direction such that the bit lines 18 and word lines 20 define code positions, and a first layer of implant resistant material 14 disposed over the substrate 12, comprises forming a plurality of code openings 16 over the code positions in the first layer of implant resistant material 14 to form a first code pattern 15 which comprises substantially all of the code openings 16. The method also includes forming a DeARC layer 22 over the substrate 12 to fill substantially all of the code openings 16. After the DeARC layer 22 is formed, a second implant resistant layer 24 is formed over the DeARC layer 22. A portion of the second implant resistant layer 24 is then processed to form a second code pattern 26 which comprises a portion of the code openings of the first code pattern 15. Subsequently or simultaneously, the DeARC layer 22 is removed from the code openings of the second code pattern 26.

Thus, by way of the present invention, a method of patterning or programming a ROM device is provided that does not use an etch-back process, such as an etch-back SOG process that may be used in forming the first code, or pre-code, pattern. Accordingly, a first code, or pre-code, pattern can thereby be effectively formed, which provides a relatively wider photo process window for the second code, or real-code, pattern. The methods disclosed herein can be easier to implement than currently available methods.

The code openings 16 may be constructed as being discontinuous relative to adjacent memory cell positions. In other words, each opening 16 may correspond to a single memory cell, and may include a border which prevents exposure of more than one memory cell channel in a single opening. In certain embodiments, the second code pattern 26 may comprise or encompass clusters of openings 16, in each cluster is spaced apart from the other cluster. For example, second code pattern 26 is illustrated as comprising a cluster of three openings 16.

In view of the foregoing, it will be understood by those skilled in the art that the methods of the present invention can facilitate formation and code programming of read only memory devices in an integrated circuit. The above-described embodiments have been provided by way of example, and the present invention is not limited to these examples. Multiple variations and modification to the disclosed embodiments will occur, to the extent not mutually exclusive, to those skilled in the art upon consideration of the foregoing description. Additionally, other combinations, omissions, substitutions and modifications will be apparent to the skilled artisan in view of the disclosure herein. Accordingly, the present invention is not intended to be limited by the disclosed embodiments, but is to be defined by reference to the appended claims.

What is claimed is:

1. A method of code programming a ROM device having bit lines oriented in a first direction on or within a substrate, word lines formed relative to the bit lines in a second direction such that the bit lines and word lines define code positions, and a first implant resistant material located over the substrate, the method comprising the following;

forming a plurality of code openings over the code positions and in the first implant resistant material to form a first code pattern which comprises substantially all of the code openings;

forming a developable anti-reflective coating layer over the substrate to fill substantially all of the code openings;

forming a second implant resistant layer over the developable anti-reflective coating layer;

processing a portion of the second implant resistant layer to form a second code pattern which comprises a portion of the code openings of the first code pattern; and removing the developable anti-reflective coating layer from the code openings of the second code pattern.

2. The method as set forth in claim 1, wherein:

the processing comprises removing a portion of the second implant resistant layer to form the second code pattern; and the removing occurs substantially simultaneously with the processing.

3. The method as set forth in claim 1, wherein:
  each code opening is formed over a word line between two bit lines; and
  the second implant resistant layer extends over and protects a bit line region, which is located between two adjacent code positions of a word line, from being contaminated with implant species during a subsequent coding step.

4. The method as set forth in claim 1, wherein the first code pattern comprises a plurality of code openings formed in a dielectric material.

5. The method as set forth in claim 4, wherein the first code pattern is formed in a layer of silicon dioxide.

6. The method as set forth in claim 1, wherein the first code pattern comprises all of the code openings of the device.

7. The method as set forth in claim 1, wherein the developable anti-reflective coating layer is formed over the substrate without mixing with the first implant resistant layer.

8. The method as set forth in claim 1, wherein the second implant resistant layer comprises photoresist.

9. The method as set forth in claim 1, wherein the second implant resistant layer is processed to form a second code pattern which comprises a plurality of non-overlapping portions of the code openings of the first code pattern.

10. The method as set forth in claim 1, wherein the first implant resistant layer is processed without an etch-back process.

11. The method as set forth in claim 1, wherein the developable anti-reflective coating is removed by developing the developable anti-reflective coating of the second code pattern.

12. The method as set forth in claim 11, wherein the removal of the developable anti-reflective coating comprises controlling a baking temperature.

13. The method as set forth in claim 11, wherein the removal of the developable anti-reflective coating comprises controlling an amount of light exposure of the developable anti-reflective coating.

14. The method as set forth in claim 11, wherein the removal of the developable anti-reflective coating comprises controlling a baking temperature and an amount of light exposure of the developable anti-reflective coating.

15. The method as set forth in claim 1, wherein the developable anti-reflective coating comprises a developable bottom anti-reflective coating.

16. A method of code programming a ROM device, comprising
  providing a substrate having a plurality of code positions, and a first code pattern which comprises a plurality of code openings that expose substantially all of the code positions;
  forming a developable anti-reflective coating over the substrate to fill the plurality of code openings, the developable anti-reflective coating comprising a component other than photoresist;and
  forming a photoresist layer over the developable anti-reflective coating and patterning the photoresist layer to form a second code pattern which comprises a portion of the plurality of code openings of the first code pattern.

17. The method as set forth in claim 16, wherein the first code pattern comprises a plurality of code openings formed in a dielectric material.

18. The method as set forth in claim 17, wherein the dielectric material comprises silicon dioxide.

19. The method as set forth in claim 16, wherein the developable anti-reflective coating is formed by a spin on coating method.

20. The method as set forth in claim 16, further comprising removing a portion of the developable anti-reflective coating to form a second code pattern, the second code pattern including less than all of the plurality of code openings.

21. The method as set forth in claim 16, wherein the developable anti-reflective coating is formed over the substrate without an etch-back process to expose portions of the first code pattern.

22. The method as set forth in claim 16, wherein the method is effective to provide a relatively wider photo process window compared to a substantially identical method practiced without a developable anti-reflective coating.

23. The method as set forth in claim 20, wherein the developable anti-reflective coating is removed by controlling at least one of baking temperature and light exposure.

24. The method as set forth in claim 20, wherein the developable anti-reflective coating is removed by exposing the developable anti-reflective coating to a photo developer.

25. A method of code programming a ROM device, comprising:
  providing a substrate having a plurality of code positions, and a first code pattern which comprises a plurality of code openings that expose substantially all of the code positions;
  forming a developable anti-reflective coating over the substrate to fill the plurality of code openings, the developable anti-reflective coating comprising a component other than photoresist; and
  forming an implant resistant layer over the developable anti-reflective coating and patterning the implant resistant layer to form a second code pattern which comprises a portion of the plurality of code openings of the first code pattern, wherein each code opening is formed over a word line between two bit lines, and the implant resistant layer extends over and protects a bit line region, which is located between two adjacent code positions of a word line, from being contaminated with implant species during a subsequent coding step.

* * * * *